United States Patent
Tseng et al.

(10) Patent No.: US 8,477,005 B2
(45) Date of Patent: Jul. 2, 2013

(54) TRANSFORMER CAPABLE OF MAINTAINING HEIGHT

(75) Inventors: Hsiang-Yi Tseng, Taoyuan Hsien (TW); Ching-Hsiang Tien, Taoyuan Hsien (TW); Yi-Lin Chen, Taoyuan Hsien (TW); Hsin-Wei Tsai, Taoyuan Hsien (TW); Chun-Song Ming, Hu Nan Province (CN)

(73) Assignee: Delta Electronics, Inc., Taoyuan Hsien (TW)

( * ) Notice: Subject to any disclaimer, the term of this patent is extended or adjusted under 35 U.S.C. 154(b) by 21 days.

(21) Appl. No.: 13/286,220

(22) Filed: Nov. 1, 2011

(65) Prior Publication Data
US 2012/0169446 A1    Jul. 5, 2012

(30) Foreign Application Priority Data
Jan. 5, 2011 (CN) .......................... 2011 1 0021882

(51) Int. Cl.
*H01F 27/29* (2006.01)
*H01F 27/06* (2006.01)
*H01F 27/30* (2006.01)

(52) U.S. Cl.
USPC .............................. 336/192; 336/65; 336/198

(58) Field of Classification Search
USPC ............... 336/65, 67, 68, 192, 196, 198, 208
See application file for complete search history.

(56) References Cited

U.S. PATENT DOCUMENTS

| | | | | |
|---|---|---|---|---|
| 5,165,056 A | * | 11/1992 | Chien-heng | 336/65 |
| 5,861,790 A | * | 1/1999 | Johnson et al. | 336/200 |
| 5,929,734 A | * | 7/1999 | Weiner | 336/61 |
| 6,876,555 B2 | * | 4/2005 | Matsumoto et al. | 361/782 |
| 7,646,276 B2 | * | 1/2010 | Yang et al. | 336/83 |
| 8,058,959 B2 | * | 11/2011 | Park et al. | 336/65 |
| 8,102,237 B2 | * | 1/2012 | Espino | 336/208 |
| 8,156,634 B2 | * | 4/2012 | Gallup et al. | 29/605 |
| 8,164,408 B2 | * | 4/2012 | Kim | 336/200 |
| 2010/0156584 A1 | * | 6/2010 | Yamaguchi et al. | 336/65 |

* cited by examiner

*Primary Examiner* — Mohamad Musleh
*Assistant Examiner* — Joselito Baisa
(74) *Attorney, Agent, or Firm* — CKC & Partners Co., Ltd.

(57) ABSTRACT

A transformer capable of maintaining its height is provided. The transformer is formed on a circuit board having a receiving hole. The transformer comprises a winding module, two magnetic core modules contacting and holding the winding module, a plurality of pins and at least one supporting means. The winding module comprises a winding baseboard and a winding pillar where a winding structure is formed thereon. The winding pillar is received in the receiving hole. Each of the pins comprises a first bent part separating the corresponding pin into a first portion connected to the winding baseboard and a second portion connected to the circuit board around the receiving hole. The supporting means is formed between the first portion of at least one of the pins and the circuit board to contact the first portion and the circuit board to maintain the distance between them.

14 Claims, 6 Drawing Sheets

TRANSFORMER CAPABLE OF MAINTAINING HEIGHT

RELATED APPLICATIONS

This application claims priority to Chinese Application Serial Number 201110021882.6, filed Jan. 5, 2011, which is herein incorporated by reference.

BACKGROUND

1. Technical Field

The present invention relates to a magnetic element. More particularly, the present invention relates to a transformer capable of maintaining its height.

2. Description of Related Art

Transformer is a common element in the electronic devices. Due to the shrinking size of the electronic devices, it is preferable to incorporate thinner transformer in the electronic devices such as the power supply of the LCD TV. Hence, in addition to the demand of high power efficiency, it is preferable to design transformers with lower height.

FIG. 1 is a 3-D diagram of a conventional transformer 1. The transformer 1 includes a winding module 10 and magnetic core 12a and 12b for holding the winding module 10, where the magnetic core 12a depicted in FIG. 1 has not combined with the magnetic core 12b to hold the winding module 10 yet. In order to preserve some space for the winding to form thereon, the height of the winding module 10 can only decrease by forming a larger hole 140 on the circuit board 14 where the winding module 10 locates and by forming two bent parts on the pins of the winding module 10. Though the winding module 10 can be disposed in the hole 140 to lower its height, there is still at least a height of H. If the height of the magnetic core 12a is added, it is hard to dramatically decrease the total height of the winding module 10 and the magnetic core 12a. Besides, the hole 140 for incorporating the whole winding module 10 takes a large area of the circuit board 14, which is not economical. Furthermore, there is no adjusting and maintaining mechanisms that are easy for the user to modify the height between the transformer 1 and the circuit board 140 in the conventional design.

Accordingly, what is needed is a transformer capable of maintaining its height and capable of dramatically reducing its height without forming a larger hole on the circuit board. The present disclosure addresses such a need.

SUMMARY

An aspect of the present disclosure is to provide a transformer capable of maintaining its height. The transformer capable is formed on a circuit board having a receiving hole. The transformer comprises a winding module, two magnetic core modules, a plurality of pins and at least one supporting means. The winding module comprises a winding pillar and a winding baseboard. A winding structure is formed on the winding pillar, wherein the winding pillar is received in the receiving hole of the circuit board. The winding baseboard is connected to one end of the winding pillar and is parallel to the circuit board. The two magnetic core modules contact and hold the winding module. The pins are formed on an edge of the winding baseboard, wherein each of the pins comprises a first bent part separating the corresponding pin into a first portion connected to the winding baseboard and a second portion connected to the circuit board around the receiving hole. The supporting means is formed between the first portion of at least one of the pins and the circuit board to contact the first portion and the circuit board to maintain the distance between the first portion and the circuit board.

According to an embodiment of the present disclosure, the supporting means is a heel block such that the first bent part, the first portion and the second portion of at least one of the pins penetrate through the heel block.

According to another embodiment of the present disclosure, the supporting means is a heel block such that the first portion of at least one of the pins penetrates through the heel block.

According to yet another embodiment of the present disclosure, the supporting means is a heel block formed between a space between the first portion and the circuit board.

According to still another embodiment of the present disclosure, the supporting means is a supporting bushing such that the second portion of at least one of the pins penetrates through the supporting bushing. The supporting bushing comprises a bushing body deformed by a squeezing process to hold the second portion. The supporting bushing is a metal material or a plastic material.

According to further another embodiment of the present disclosure, the second portion of at least one of the pins substantially comprises a second bent part, a connection part and a second portion main body, where the second portion is separated into the second portion main body and the connection part by the second bent part, wherein the supporting means is substantially the connection part placed between the first and the second bent parts to contact the first portion and the circuit board. The second portion main body is mounted on the circuit board.

According to another embodiment of the present disclosure, one of the two magnetic core modules is corresponding to the winding baseboard and the other is corresponding to the winding pillar to contact and hold the winding structure. The winding pillar comprises a hollow central part connected to an opening of the winding baseboard and each of the two magnetic core modules comprises a base part and a central pillar part, wherein the base parts of the two magnetic core modules are adapted to each other such that the central pillar parts of the two magnetic core modules are placed in the hollow central part to make the two magnetic core modules contact and hold the winding structure.

According to yet another embodiment of the present disclosure, the winding structure comprises at least one winding portion. The two magnetic core modules are metal magnetic material. The circuit board further comprises a plurality of pinholes such that the second portion of the pins is placed in the pinholes.

It is to be understood that both the foregoing general description and the following detailed description are by examples, and are intended to provide further explanation of the invention as claimed.

BRIEF DESCRIPTION OF THE DRAWINGS

The invention can be more fully understood by reading the following detailed description of the embodiments, with reference made to the accompanying drawings as follows.

DETAILED DESCRIPTION

Figure 1:
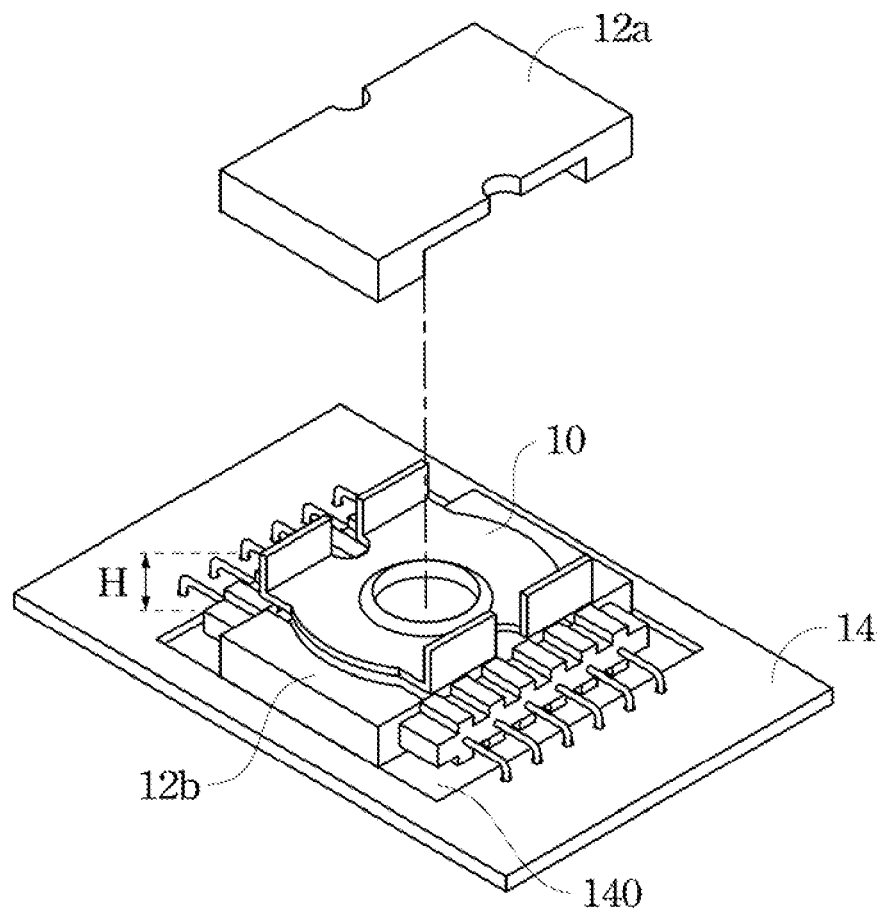
FIG. 1 is a 3-D diagram of a conventional transformer.

Reference will now be made in detail to the present embodiments of the invention, examples of which are illustrated in the accompanying drawings. Wherever possible, the same reference numbers are used in the drawings and the description to refer to the same or like parts.

Figure 2A:
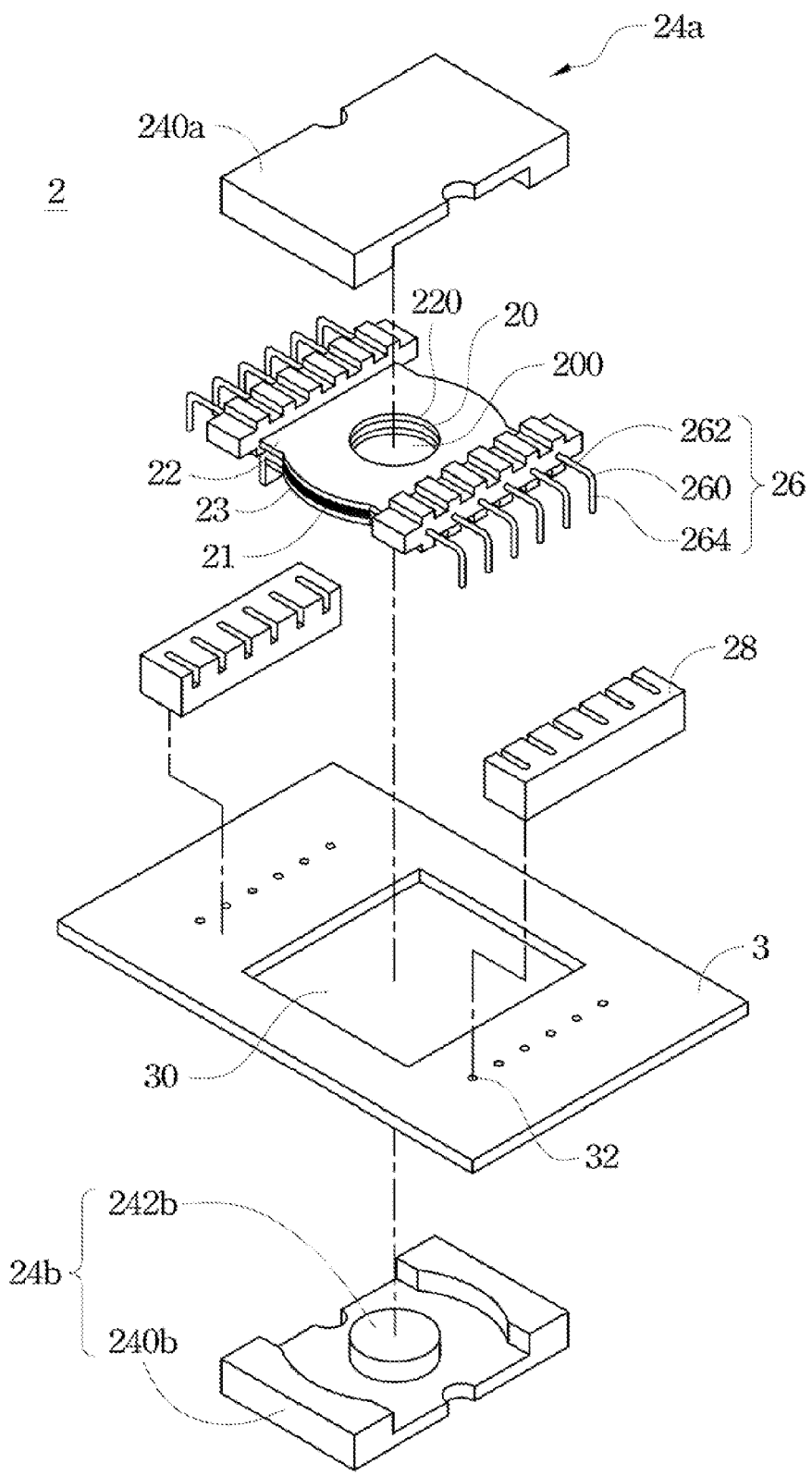
FIG. 2A is an exploded view of a transformer capable of maintaining its height in an embodiment of the present disclosure.
Figure 2B:
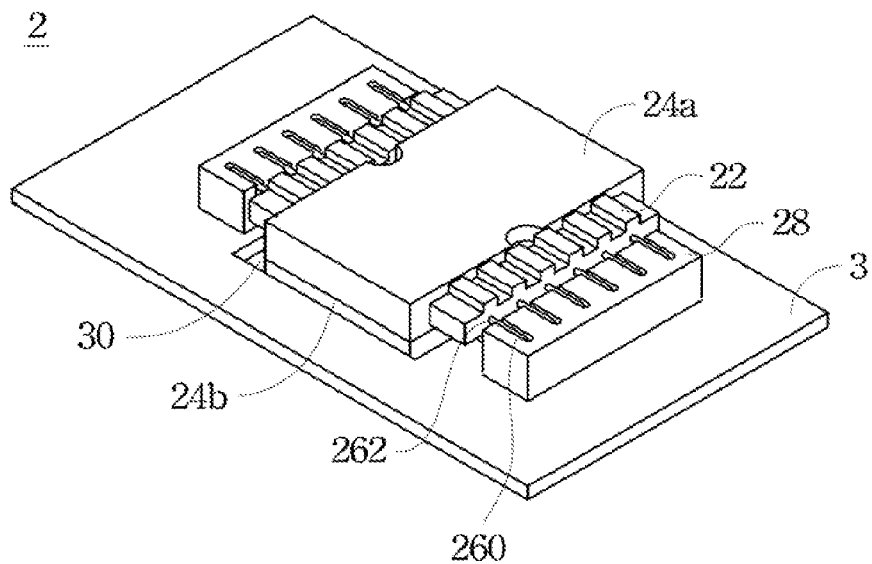
FIG. 2B is a 3-D view of the combined transformer depicted in FIG. 2A.

Please refer to FIG. 2A and FIG. 2B. FIG. 2A is an exploded view of a transformer 2 capable of maintaining its height in an embodiment of the present disclosure. FIG. 2B is a 3-D view of the combined transformer 2 depicted in FIG. 2A, wherein the transformer 2 is formed on the circuit board 3.

The transformer 2 is formed on the circuit board 3. The circuit board 3 comprises a receiving hole 30. The transformer 2 comprises a winding module, two magnetic core modules 24a and 24b, a plurality of pins 26 and a supporting means 28.

The winding module comprises a winding pillar 20 for a winding structure 21 formed thereon and a winding baseboard 22. In FIG. 2A, the winding structure 21 comprises one winding portion. However, in other embodiments, the winding structure 21 may comprises a plurality of winding portion depending on different applications. The winding pillar 20 is received in the receiving hole 30 of the circuit board 3 depicted in FIG. 2A. The winding baseboard 22 is connected to one end of the winding pillar 20 and is parallel to the circuit board 3. In the present embodiment, the winding module further comprises a baffle board 23 formed on an end of the winding pillar 20 opposite to the winding baseboard 22 to baffle the winding structure 21 such that the winding structure 21 will not slide out of the winding pillar 20. In other embodiments, other baffling mechanisms can be adapted.

The two magnetic core modules 24a and 24b are metal magnetic material. The magnetic core module 24a contacts the winding baseboard 22 and the magnetic core module 24b contacts the winding pillar 20 such that the magnetic core modules 24a and 24b together hold the winding module.

In the present embodiment, the winding pillar 20 comprises a hollow central part 200 connected to an opening 220 of the winding baseboard 22. Each of the two magnetic core modules 24a and 24b comprises a base part 240a, 240b and a central pillar part 242b (the central pillar part of the magnetic core module 24a is not shown due to the direction of the view). The base parts 240a and 240b are adapted to each other such that the central pillar part of the magnetic core module 24a and the central pillar part 242b of the magnetic core module 24b are placed in the hollow central part 200 to make the two magnetic core modules 24a and 24b contact and hold the winding structure.

The pins are formed on an edge of the winding baseboard 22 to connect the winding baseboard 22 and circuit board 3 around the receiving hole 30. The winding structure 21 formed on the winding pillar 20 described above is connected to the pins 26 and is further electrically connected to the elements on the circuit board 3 through the pins 26. Each of the pins 26 comprises a first bent part 260 separating the corresponding pin 26 into a first portion 262 connected to the winding baseboard 22 and a second portion 264 connected to the circuit board 3. In an embodiment, the circuit board 3 comprises a plurality of pinholes 32 as shown in FIG. 2A such that the second portion 264 of the pins 26 can be placed in the pinholes 32. It's noticed that the second portion 264 is not shown in FIG. 2B because of the presence of the circuit board 3.

The supporting means 28 is formed between the first portion 262 of the pins 26 and the circuit board 3. In the present embodiment, the supporting means 28 is a heel block such that the first bent part 260, the first portion 262 and the second portion 264 of the pins 26 penetrate through the supporting means 28. The supporting means 28 contacts the first portion 262 and the circuit board 3 to maintain the distance, i.e. the height M, between the first portion 262 and the circuit board 3. The supporting means 28 can be designed to have an appropriate size to maintain the height M between the first portion 262 and the circuit board 3.

Hence, the height of the transformer 2 in the present embodiment can be greatly reduced because the winding pillar 20 of the transformer 2 can be disposed in the receiving hole 30 of the circuit board 3. The receiving hole 30 only receives the winding pillar 20 and the two magnetic core modules 24a and 24b. It does not need a large hole formed on the circuit board. Further, the height M of the first portion 262 relative to the circuit board 3 can be maintained by selecting the supporting means 28 with the appropriate height.

Figure 3:
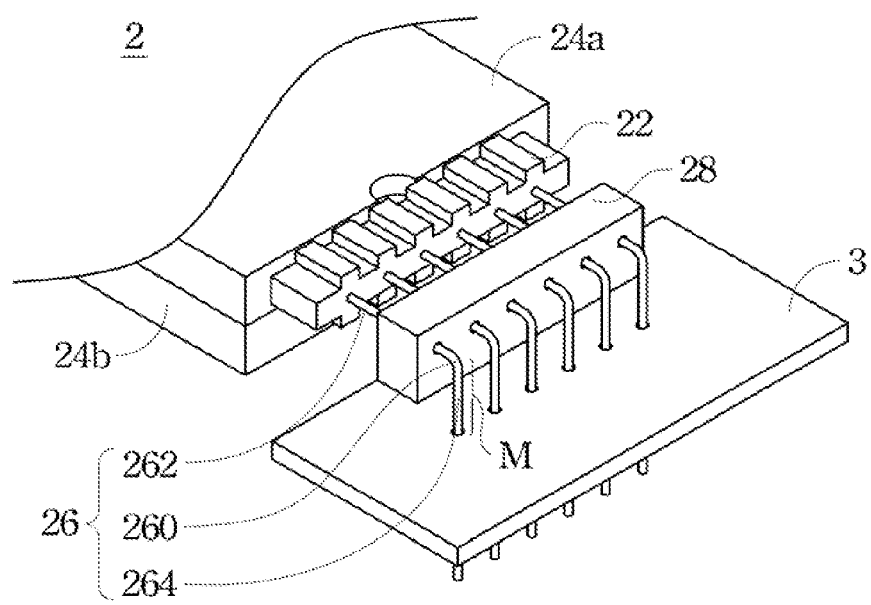
FIG. 3 to FIG. 8 are partial 3-D views of the transformer formed on the circuit board in different embodiments of the present disclosure.

Please refer to FIG. 3. FIG. 3 is a partial 3-D view of the transformer 2 formed on the circuit board 3 in another embodiment of the present disclosure. It's noticed that in order to give a clear explanation of the elements, only a part of the circuit board 3 is shown.

Similar to the previous embodiment, the transformer 2 is formed on the circuit board 3. In FIG. 3, only the two magnetic core modules 24a and 24b, the pins 26 and the supporting means 28 of the transformer 2 are shown.

The supporting means 28 in the present embodiment is a heel block such that the first portion 262 of the pins 26 penetrates through the supporting means 28. Further, the supporting means 28 contacts the circuit board 3 to maintain the height M between the first portion 262 and the circuit board 3.

Figure 4:
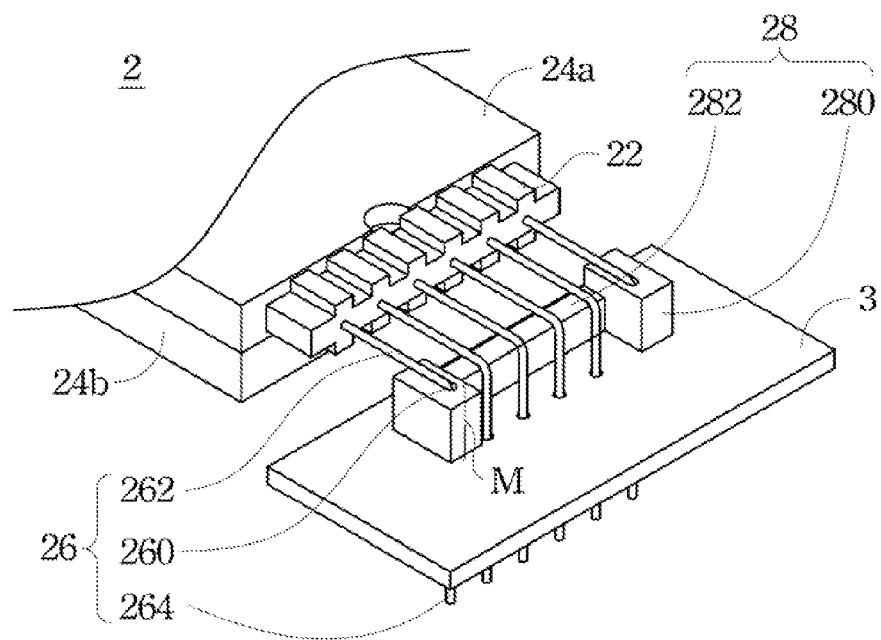

Please refer to FIG. 4. FIG. 4 is a partial 3-D view of the transformer 2 formed on the circuit board 3 in yet another embodiment of the present disclosure.

Similar to the previous embodiment, the transformer 2 is formed on the circuit board 3. In FIG. 4, only the two magnetic core modules 24a and 24b, the pins 26 and the supporting means 28 of the transformer 2 are shown.

The supporting means 28 in the present embodiment substantially comprises heel blocks 280 and a heel block 282. The heal blocks 280 is similar to the supporting means 28 depicted in FIG. 2B such that the first bent part 260, the first portion 262 and the second portion 264 of the pins 26 penetrate through the heel blocks 280, and the heel blocks 280 contact the first portion 262 and the circuit board 3. The heel block 282 is formed between a space between the first portion 262 of the pins 26 and the circuit board 3, and the heel block 282 contacts the first portion 262 and the circuit board 3 as well. Hence, the supporting means can maintain the height M between the first portion 262 and the circuit board 3.

Figure 5:
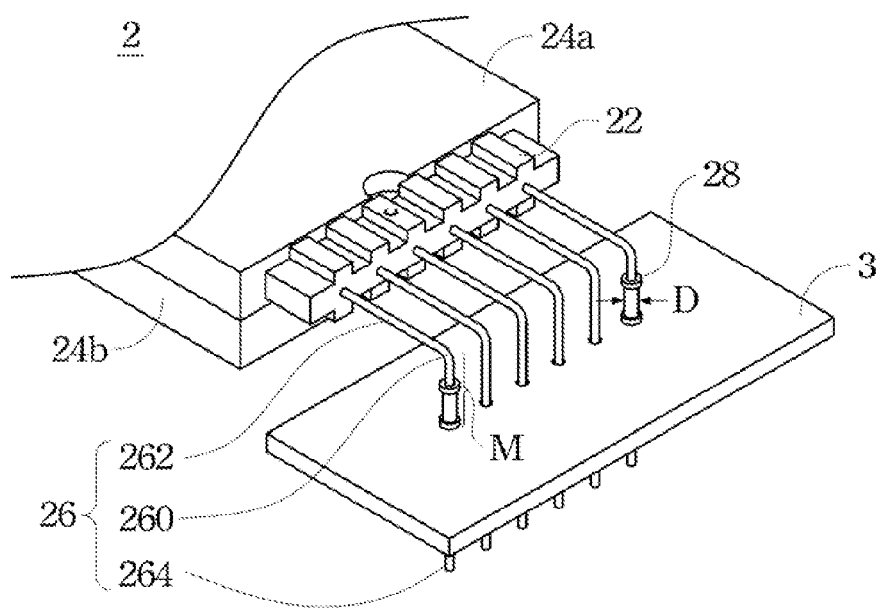

Please refer to FIG. 5. FIG. 5 is a partial 3-D view of the transformer 2 formed on the circuit board 3 in still another embodiment of the present disclosure.

Similar to the previous embodiment, the transformer 2 is formed on the circuit board 3. In FIG. 5, only the two magnetic core modules 24a and 24b, the pins 26 and the supporting means 28 of the transformer 2 are shown.

The supporting means 28 in the present embodiment is a supporting bushing such that the second portion 264 of the pins 26 penetrates through the supporting bushing. The supporting means 28 contacts the first portion 262 and the circuit board 3. Hence, the supporting means can maintain the height M between the first portion 262 and the circuit board 3. In an embodiment, the bushing body of the supporting bushing can be made of metal material and can be deformed by a squeezing process to hold the second portion 264. The squeezing process can be performed by applying a force in the direction shown as double arrows D in FIG. 5 to deform the body of the supporting bushing to hold the second portion 264 firmly to provide a more stable height-maintaining mechanism.

Figure 6:
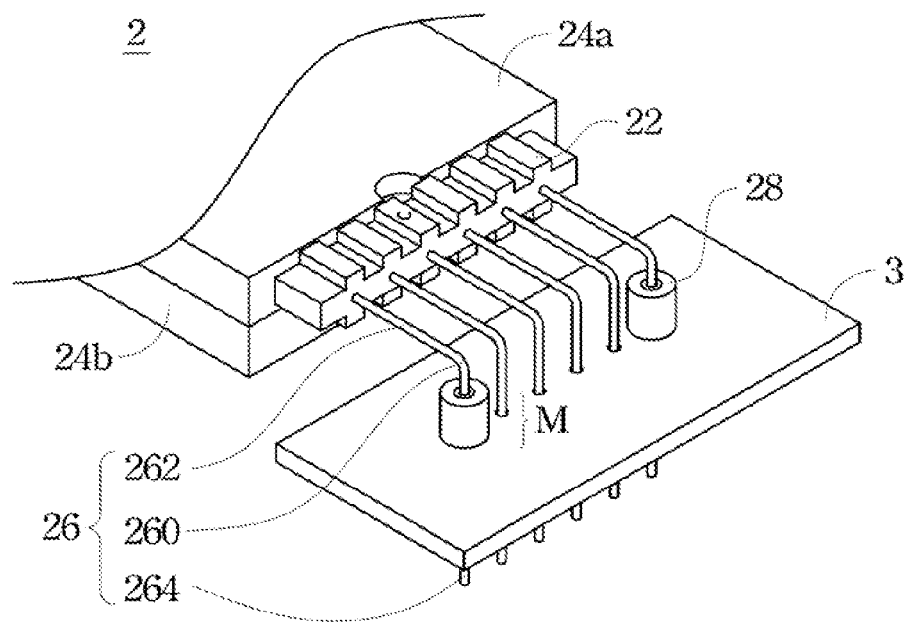

Please refer to FIG. 6. FIG. 6 is a partial 3-D view of the transformer 2 formed on the circuit board 3 in another embodiment of the present disclosure.

Similar to the previous embodiment, the transformer 2 is formed on the circuit board 3. In FIG. 6, only the two magnetic core modules 24a and 24b, the pins 26 and the supporting means 28 of the transformer 2 are shown.

The supporting means 28 in the present embodiment is a supporting bushing such that the second portion 264 of the pins 26 penetrates through the supporting bushing. The supporting means 28 contacts the first portion 262 and the circuit board 3. Hence, the supporting means can maintain the height M between the first portion 262 and the circuit board 3. In the present embodiment, the supporting bushing is made of plastic material and has a thicker body. The squeezing process can also be applied on the plastic-made supporting bushing if the process is applied carefully without breaking the supporting bushing to hold the second portion 264 firmly to provide a more stable height-maintaining mechanism.

Figure 7:
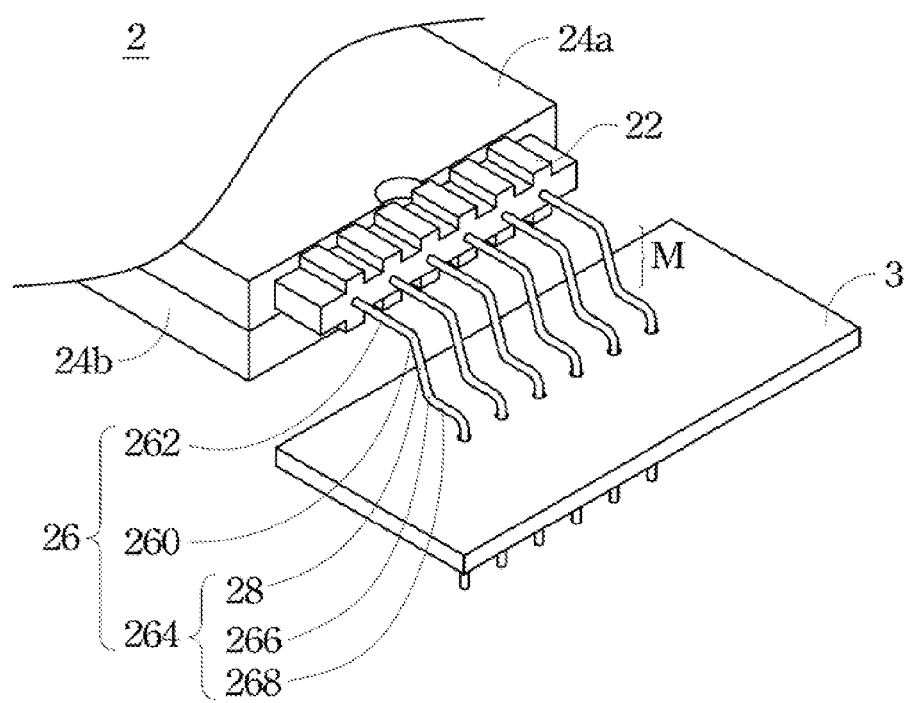

Please refer to FIG. 7. FIG. 7 is a partial 3-D view of the transformer 2 formed on the circuit board 3 in another embodiment of the present disclosure.

Similar to the previous embodiment, the transformer 2 is formed on the circuit board 3. In FIG. 7, only the two magnetic core modules 24a and 24b, the pins 26 and the supporting means 28 of the transformer 2 are shown.

In the present embodiment, the second portion 264 of the pins 26 substantially comprises a second bent part 266, a connection part and a second portion main body 268. The second bent part 266 is formed between the second portion main body 268 and the connection part. The supporting means 28 in the present embodiment is substantially the connection part of the second portion 264, which is connected to the first and the second bent parts 260 and 266. The supporting means 28 is further connected to the first portion 262 and the second portion main body 268 through the first bent part 260 and the second bent part 266. The supporting means 28 contacts the first portion 262 through the first bent part 260 and contacts the circuit board 3 through the second bent part 266. It's noticed that the second portion main body 268 is mounted on the circuit board 3 to fasten the pins 26. Hence, the supporting means can maintain the height M between the first portion 262 and the circuit board 3.

Figure 8:
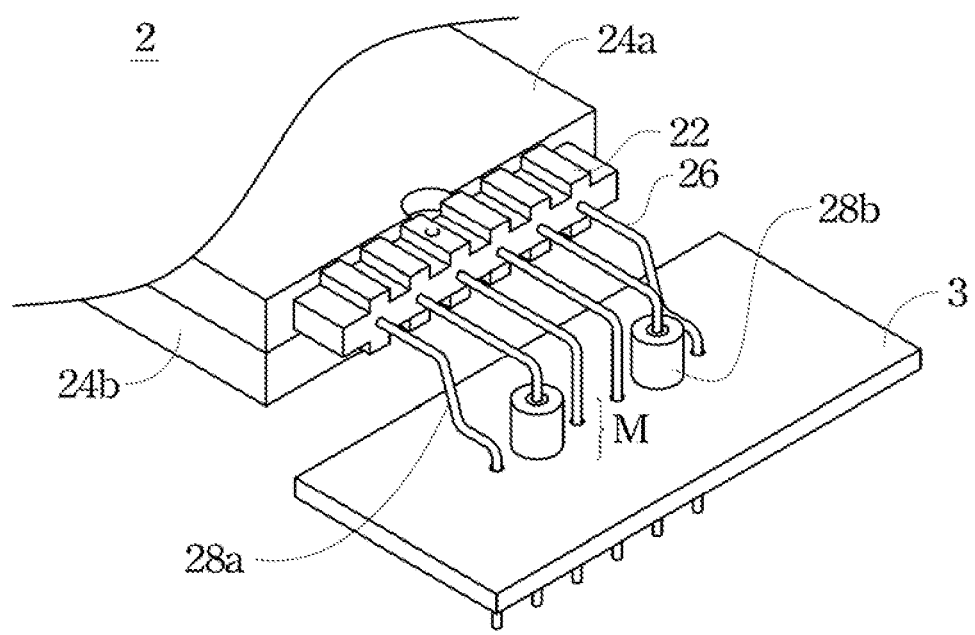

It's noticed that the each type of supporting means 28 described in the above embodiments can be adapted to different number of pins, depending on different applications. Various modifications and variations can be made to the structure of the drawings mentioned previously without departing from the scope or spirit of the invention. Besides, various kinds of supporting means 28 can be applied to different pins at the same time. Please refer to FIG. 8. FIG. 8 is a partial 3-D view of the transformer 2 formed on the circuit board 3 in another embodiment of the present disclosure. In FIG. 7, only the two magnetic core modules 24a and 24b, the pins 26 and the supporting means 28a and 28b of the transformer 2 are shown. The supporting means 28a and 28b are the types of supporting means shown in FIG. 7 and FIG. 6 respectively. Hence, after selecting the supporting means that can maintain the same height M between the first portion 262 and the circuit board 3, these supporting means with different types can be applied on the pins 26 of the same transformer 2.

The height of the transformer of the present disclosure can be greatly reduced because the winding pillar of the transformer can be disposed in a smaller receiving hole of the circuit board. Further, the height of the transformer can be easily maintained with the use of the supporting means.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims.

What is claimed is:

1. A transformer capable of maintaining its height formed on a circuit board having a receiving hole, comprising:
    a winding module comprising:
        a winding pillar where a winding structure is formed thereon, wherein the winding pillar is received in the receiving hole of the circuit board; and
        a winding baseboard connected to one end of the winding pillar and parallel to the circuit board;
    two magnetic core modules contacting and holding the winding module;
    a plurality of pins formed on an edge of the winding baseboard, wherein each of the pins comprises a first bent part separating the corresponding pin into a first portion connected to the winding baseboard and a second portion connected to the circuit board around the receiving hole; and
    at least one supporting means formed between two ends of at least one of the pins to contact the first portion and the circuit board to maintain the distance between the first portion and the circuit board.

2. The transformer of claim 1, wherein the supporting means is a heel block such that the first bent part, the first portion and the second portion of at least one of the pins penetrate through the heel block.

3. The transformer of claim 1, wherein the supporting means is a heel block such that the first portion of at least one of the pins penetrates through the heel block.

4. The transformer of claim 1, wherein the supporting means is a heel block formed between a space between the first portion and the circuit board.

5. The transformer of claim 1, wherein the supporting means is a supporting bushing such that the second portion of at least one of the pins penetrates through the supporting bushing.

6. The transformer of claim 5, wherein the supporting bushing comprises to a bushing body deformed by a squeezing process to hold the second portion.

7. The transformer of claim 5, wherein the supporting bushing is a metal material or a plastic material.

8. The transformer of claim 1, wherein the second portion of at least one of the pins substantially comprises a second bent part, a connection part and a second portion main body, where the second portion is separated into the second portion main body and the connection part by the second bent part, wherein the supporting means is substantially the connection part placed between the first and the second bent parts to contact the first portion and the circuit board.

9. The transformer of claim 8, wherein the second portion main body is mounted on the circuit board.

10. The transformer of claim 1, wherein one of the two magnetic core modules is corresponding to the winding baseboard and the other is corresponding to the winding pillar to contact and hold the winding structure.

11. The transformer of claim 10, wherein the winding pillar comprises a hollow central part connected to an opening of the winding baseboard and each of the two magnetic core modules comprises a base part and a central pillar part, wherein the base parts of the two magnetic core modules are adapted to each other such that the central pillar parts of the two magnetic core modules are placed in the hollow central part to make the two magnetic core modules contact and hold the winding structure.

12. The transformer of claim 1, wherein the winding structure comprises at least one winding portion.

13. The transformer of claim 1, wherein the two magnetic core modules are metal magnetic material.

14. The transformer of claim 1, wherein the circuit board further comprises a plurality of pinholes such that the second portion of the pins is placed in the pinholes.

* * * * *